(12) United States Patent
Zhang et al.

(10) Patent No.: US 12,317,569 B2
(45) Date of Patent: *May 27, 2025

(54) SEMICONDUCTOR DEVICE WITH MULTICHANNEL HETEROSTRUCTURE AND MANUFACTURING METHOD THEREOF

(71) Applicant: INNOSCIENCE (ZHUHAI) TECHNOLOGY CO., LTD., Zhuhai (CN)

(72) Inventors: Anbang Zhang, Zhuhai (CN); King Yuen Wong, Zhuhai (CN); Hao Li, Zhuhai (CN); Haoning Zheng, Zhuhai (CN); Jian Wang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/646,773

(22) Filed: Apr. 26, 2024

(65) Prior Publication Data
US 2024/0297231 A1  Sep. 5, 2024

Related U.S. Application Data

(62) Division of application No. 17/266,637, filed as application No. PCT/CN2020/086134 on Apr. 22, 2020, now Pat. No. 12,009,396.

(51) Int. Cl.
*H10D 64/23* (2025.01)
*H10D 30/47* (2025.01)
(Continued)

(52) U.S. Cl.
CPC ......... *H10D 64/256* (2025.01); *H10D 30/475* (2025.01); *H10D 30/637* (2025.01); *H10D 62/824* (2025.01); *H10D 62/8503* (2025.01)

(58) Field of Classification Search
CPC ........... H01L 29/41766; H01L 29/2003; H01L 29/66462; H01L 29/7786; H01L 29/7838;
(Continued)

(56) References Cited

U.S. PATENT DOCUMENTS 6,992,319 B2    1/2006   Fahimulla et al.
8,466,494 B2    6/2013   Tamari
(Continued)

FOREIGN PATENT DOCUMENTS

CN    102651389    8/2012
CN    103098221    5/2013
(Continued)

OTHER PUBLICATIONS

Aditya Raj et al., "Demonstration of a GaN/AlGaN superlattice-based p-channel FinFET with high on-current", IEEE Electron Device Letters, Jan. 1, 2020, vol. 41, Issue. 2, pp. 1-4.
(Continued)

*Primary Examiner* — Peter M Albrecht
(74) *Attorney, Agent, or Firm* — JCIPRNET

(57) ABSTRACT

A semiconductor device and a method for manufacturing the same are provided in this disclosure. The semiconductor device includes a semiconductor heterostructure layer. The semiconductor heterostructure layer includes alternating first semiconductor material layers and second semiconductor material layers. Two-dimensional hole gas (2DHG) may be generated between each first semiconductor material layer and adjacent second semiconductor material layer. A conductive structure, including a plurality of conductive fingers extends from a surface of the semiconductor heterostructure layer into the semiconductor heterostructure layer. The plurality of conductive fingers are arranged in a direction substantially parallel to the surface. The lengths of the plurality of conductive fingers progressively increase in that (Continued)

direction so that an end portion of each conductive finger is respectively positioned in a different first semiconductor material layer and is in contact with the 2DHG.

18 Claims, 14 Drawing Sheets

(51) Int. Cl.
*H10D 30/63* (2025.01)
*H10D 62/824* (2025.01)
*H10D 62/85* (2025.01)

(58) Field of Classification Search
CPC .............. H10D 64/256; H10D 62/8503; H10D 62/824; H10D 30/475; H10D 30/637
See application file for complete search history.

(56) References Cited

U.S. PATENT DOCUMENTS

| | | | |
|---|---|---|---|
| 9,059,266 B2 | 6/2015 | Mitsunaga | |
| 9,087,889 B2 | 7/2015 | Nakajima et al. | |
| 9,419,121 B1 | 8/2016 | Teo et al. | |
| 9,570,436 B2 | 2/2017 | Nakajima et al. | |
| 9,685,445 B2 | 6/2017 | Mitsunaga | |
| 10,109,632 B2 | 10/2018 | Mitsunaga | |
| 10,629,598 B2 | 4/2020 | Mitsunaga | |
| 11,942,525 B2* | 3/2024 | Zhang ............... H01L 29/41766 | |
| 2012/0211802 A1 | 8/2012 | Tamari | |
| 2013/0105812 A1 | 5/2013 | Ishigaki et al. | |
| 2013/0221409 A1 | 8/2013 | Nakajima et al. | |
| 2013/0307022 A1 | 11/2013 | Mitsunaga | |
| 2013/0334573 A1 | 12/2013 | Ostermaier et al. | |
| 2014/0264273 A1* | 9/2014 | Howell ............. H01L 29/41766 257/20 |
| 2015/0155273 A1 | 6/2015 | Nakajima et al. | |
| 2015/0270266 A1 | 9/2015 | Mitsunaga | |
| 2017/0271333 A1 | 9/2017 | Mitsunaga | |
| 2019/0051649 A1 | 2/2019 | Mitsunaga | |
| 2020/0227412 A1 | 7/2020 | Mitsunaga | |

FOREIGN PATENT DOCUMENTS

| | | |
|---|---|---|
| CN | 103426922 | 12/2013 |
| CN | 104395993 | 3/2015 |
| CN | 106796890 | 5/2017 |
| CN | 108028273 | 5/2018 |
| TW | 354419 | 3/1999 |
| TW | 439262 | 6/2001 |

OTHER PUBLICATIONS

"International Search Report (Form PCT/ISA/210) of PCT/CN2020/086134," mailed on Jan. 21, 2021, with English translation thereof, pp. 1-8.

"Written Opinion of the International Searching Authority (Form PCT/ISA/237) of PCT/CN2020/086134," mailed on Jan. 21, 2021, with English translation thereof, pp. 1-7.

"Office Action of China Application No. 202080001199.3", issued on Aug. 31, 2021, with Machine/Partial English translation thereof, pp. 1-14.

"Office Action of China Application No. 202080001199.3", issued on Jun. 7, 2022, with Machine/Partial English translation thereof, pp. 1-15.

"Decision of Rejection of China Application No. 202080001199.3", issued on Jan. 5, 2023, with Machine/Partial English translation thereof, pp. 1-13.

* cited by examiner

SEMICONDUCTOR DEVICE WITH MULTICHANNEL HETEROSTRUCTURE AND MANUFACTURING METHOD THEREOF

CROSS-REFERENCE TO RELATED APPLICATIONS

This application is a divisional application of U.S. patent application Ser. No. 17/266,637, filed on Feb. 8, 2021, which is a national stage of International Application No. PCT/CN2020/086134, filed on Apr. 22, 2020. All of the aforementioned patent applications are hereby incorporated by reference in their entireties.

BACKGROUND OF THE INVENTION

1. Field of the Invention

The present disclosure relates to a semiconductor device and a manufacturing method thereof, and more particularly, to a heterostructure device with a multichannel heterostructure and a manufacturing method thereof.

2. Description of the Related Art

High-power devices often form field effect transistors (FETs) by using semiconductor materials with larger energy gaps, such as semiconductor materials of GaN, AlN, and the like with large energy gaps, to provide high breakdown voltages and low reverse currents.

In an FET of a stacked semiconductor structure, a narrow-energy-gap semiconductor forming a "channel layer" is adjacent to a wide-energy-gap semiconductor forming an "electron supply layer", so that the electron supply layer generates a high concentration of electrons accumulated at an interface of the channel layer and the electron supply layer. These accumulated electrons form a thin flake type distribution which may also be called "two-dimensional electron gas (2DEG)". Similarly, accumulated holes form a thin flake type distribution which may also be called "two-dimensional hole gas (2DHG)".

The 2DHG has a very high electron hole mobility, and can be applied to a high-speed electronic assembly and a power assembly.

SUMMARY OF THE INVENTION

Some embodiments of the present disclosure provide a semiconductor device. The semiconductor device includes a semiconductor heterostructure layer, including alternating first semiconductor material layers and second semiconductor material layers; and a conductive structure, including a plurality of conductive fingers extending from a surface of the semiconductor heterostructure layer into the semiconductor heterostructure layer. 2DHGs may be generated between each first semiconductor material layer and adjacent second semiconductor material layer. The plurality of conductive fingers are arranged in a direction substantially parallel to the surface of the semiconductor heterostructure layer. The lengths of the plurality of conductive fingers progressively increase in that direction, so that an end portion of each conductive finger is respectively positioned in a different first semiconductor material layer and is in contact with the 2DHG.

Other embodiments of the present disclosure provide a semiconductor device. The semiconductor device includes a semiconductor heterostructure layer, including alternating first semiconductor material layers and second semiconductor material layers; a first electrode structure, including a plurality of first conductive fingers extending from a surface of the semiconductor heterostructure layer into the semiconductor heterostructure layer; a second electrode structure, including a plurality of second conductive fingers extending from the surface into the semiconductor heterostructure layer. 2DHG can be generated between each first semiconductor material layer and its adjacent second semiconductor material layer. The plurality of first conductive fingers are arranged in a direction substantially parallel to the surface. The lengths of the plurality of first conductive fingers progressively increase in that direction, so that an end portion of each first conductive finger is respectively positioned in a different first semiconductor material layer and is in contact with the 2DHGs. The plurality of second conductive fingers are arranged in that direction. The lengths of the plurality of second conductive fingers progressively decrease in that direction. An end portion of each second conductive finger is respectively positioned in a different second semiconductor material layer and is not in contact with the 2DHGs.

Some embodiments of the present disclosure provide a manufacturing method of a semiconductor device, including: forming a semiconductor heterostructure layer, including alternately forming first semiconductor material layers and second semiconductor material layers, where 2DHGs can be generated between each first semiconductor material layer and its adjacent second semiconductor material layer; patterning a surface of the semiconductor heterostructure layer to form a plurality of openings in a first direction substantially parallel to the surface of the semiconductor heterostructure layer; etching the semiconductor heterostructure layer from the plurality of openings so as to form a plurality of trenches in the semiconductor heterostructure layer, where the lengths of the plurality of trenches progressively increase in the first direction, the etching stops in different first semiconductor material layers, and a bottom of each trench is in contact with the 2DHGs; depositing a conductive material in the plurality of trenches so as to form a conductive structure.

BRIEF DESCRIPTION OF THE DRAWINGS

The aspects of the present disclosure will become more comprehensible from the following detailed description made with reference to the accompanying drawings. It should be noted that various features may not be drawn to scale. In fact, the sizes of the various features may be increased or reduced arbitrarily for the purpose of clear description.

PREFERRED EMBODIMENT OF THE PRESENT INVENTION

Figure 1A:
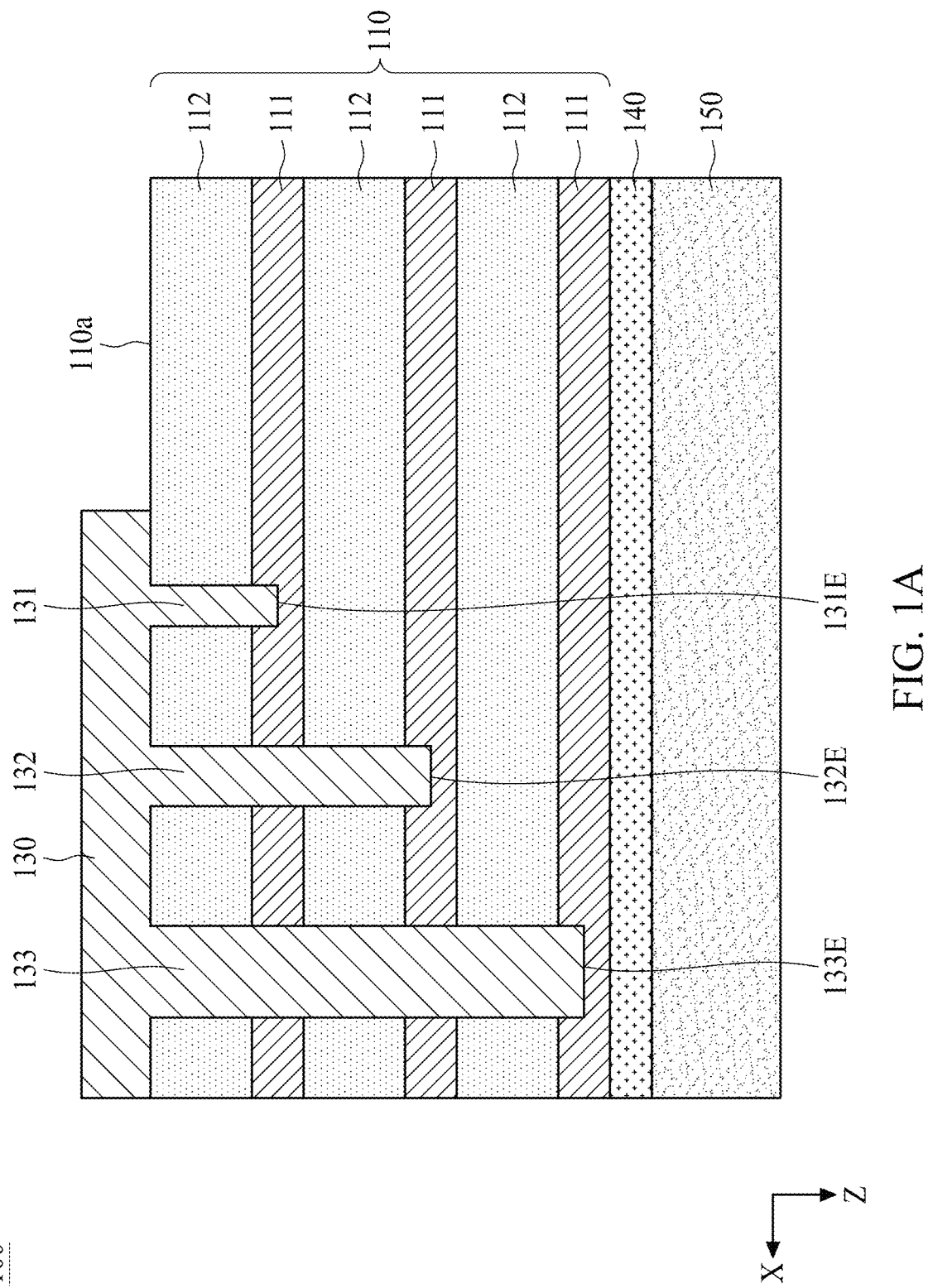
FIG. 1A is a cross-sectional view of a semiconductor device according to some embodiments of the present disclosure.

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to not be in direct contact. In addition, in the present invention, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

FIG. 1A is a cross-sectional view of a semiconductor device 100 according to some embodiments of the present disclosure. The semiconductor device 100 includes a semiconductor heterostructure layer 110 and a conductive structure 130. According to some embodiments of the present disclosure, the semiconductor device 100 further includes a buffer layer 140 and a carrier 150.

The carrier 150 may be a semiconductor substrate, a glass substrate, a PCB substrate, a flexible substrate (for example, a polymer or paper) or any medium capable of carrying the semiconductor heterostructure layer 110. The buffer layer 140 may be further provided between the semiconductor heterostructure layer 110 and the carrier 150. In some embodiments, a buffer layer 140 is formed between a semiconductor material layer 111 and the carrier 150. In some embodiments, the buffer layer 140 may be of a superlattice structure consisting of AlGaN and GaN. The thickness of the buffer layer 140 is in a range of about 0.5 μm to 10 μm.

The semiconductor heterostructure layer 110 includes a stack of alternating semiconductor material layers 111 and semiconductor material layers 112. The semiconductor material layers 111 and the semiconductor material layers 112 are formed by semiconductor materials with different energy gaps, so that 2DHGs (not shown) can be generated between each semiconductor material layer 111 and its adjacent semiconductor material layer 112.

The semiconductor material layers 111 and the semiconductor material layers 112 are formed by the semiconductor materials with different energy gaps. Through piezoelectricity, the 2DHGs are formed at interfaces of the semiconductor material layers 111 and the semiconductor material layers 112 under the dual effects of spontaneous polarization and piezoelectric polarization. Compared with the semiconductor material layers 112, the semiconductor material layers 111 have wider energy gap. For example, in an embodiment, the semiconductor material layers 111 are AlGaN, and the energy gap is about 4 eV; and the semiconductor material layers 112 are GaN, and the energy gap is about 3.4 eV.

According to some embodiments of the present disclosure, the semiconductor material layers 111 and the semiconductor material layers 112 may respectively include group III-V compounds. A combination of the semiconductor material layers 111 and the semiconductor material layers 112 may include, but is not limited to, one of the following: a combination of AlGaN and GaN, a combination of InAlN and GaN, a combination of AlN and GaN, and a combination of InAlGaN and GaN.

In an embodiment, the thickness of the semiconductor heterostructure layer 110 is in a range of 8 nm to 1000 nm. In an embodiment, the thickness of each semiconductor material layer 111 in the semiconductor heterostructure layer 110 is in a range of 2 nm to 30 nm. In an embodiment, the thickness of each semiconductor material layer 111 is in a range of 3 nm to 10 nm. The thickness of the semiconductor material layer 112 in the semiconductor heterostructure layer 110 may be greater than or equal to that of the semiconductor material layer 111. In an embodiment, the thickness of each semiconductor material layer 112 in the semiconductor heterostructure layer 110 is in a range of 2 nm to 70 nm. In an embodiment, the thickness of each semiconductor material layer 112 is in a range of 3 nm to 20 nm.

In some embodiments, an interposer layer (not shown in the figures) may be provided between the semiconductor material layers 111 and the semiconductor material layers 112. The interposer layer may include AlN, and the thickness may be about 1 nm.

According to the present disclosure, the 2DHGs between the semiconductor material layers 111 and the semiconductor material layers 112 provide multiple channels for the semiconductor device to transfer electron holes and form a multichannel heterostructure device. In some embodiments, the 2DHGs between the semiconductor material layers 111 and the semiconductor material layers 112 in the semiconductor heterostructure layer 110 include at least 2 layers. In preferred embodiments, the number of layers of the 2DHGs is in a range of 2 to 10.

The conductive structure 130 includes conductive fingers 131, 132, and 133. The conductive fingers 131, 132, and 133 are arranged in a direction substantially parallel to a surface 110a of the semiconductor heterostructure layer 110. End portions 131E, 132E, and 133E of each conductive finger are positioned at different depths in the semiconductor material layers 111, and are in contact with the 2DHGs.

In the present embodiment, the conductive structure 130 includes 3 conductive fingers 131, 132, and 133. However, according to the present disclosure, the number of conductive fingers may be any integer greater than or equal to 2, and is not limited to the above embodiments. According to some preferred embodiments of the present disclosure, the conductive structure 130 may include 2 to 10 conductive fingers. In some embodiments, the number of conductive fingers is associated with the number of interfaces between the semiconductor material layers 111 and the semiconductor material layers 112. Taking FIG. 1A as an example, the number of interfaces between the semiconductor material layers 111 and the semiconductor material layers 112 and the number of conductive fingers are both three. According to other embodiments, both the number of interfaces between the semiconductor material layers 111 and the semiconductor material layers 112 and the number of conductive fingers may be four, five, or other integers.

The conductive fingers may be arranged in a direction X as shown in FIG. 1A. Additionally, the lengths of the conductive fingers 131, 132, and 133 extending deep into the semiconductor heterostructure layer 110 gradually increase in the direction X. That is, the conductive finger 131 is the shortest, the conductive finger 132 is medium-length, and the conductive finger 133 is the longest. However, in other embodiments, the conductive fingers 131, 132, and 133 may also be arranged in other directions substantially parallel to the surface 110a. Additionally, the lengths of the conductive fingers 131, 132, and 133 extending deep into the semiconductor heterostructure layer 110 may gradually increase in the arrangement direction.

In some embodiments of the present disclosure, the widths of the conductive fingers are substantially identical. In some preferred embodiments of the present disclosure, the widths of the conductive fingers are increased along with their length. For example, in FIG. 1A, the lengths of the conductive fingers 131, 132, and 133 gradually increase in the direction X, and the widths are also gradually increased in the direction X. In some preferred embodiments, the lengths of the conductive fingers are in a range of 1 nm to 1000 nm, and the widths are in a range of 5 nm to 800 nm. In some more preferred embodiments, the lengths of the conductive fingers are in a range of 1 nm to 300 nm, and the widths are in a range of 5 nm to 200 nm.

Figure 1B:
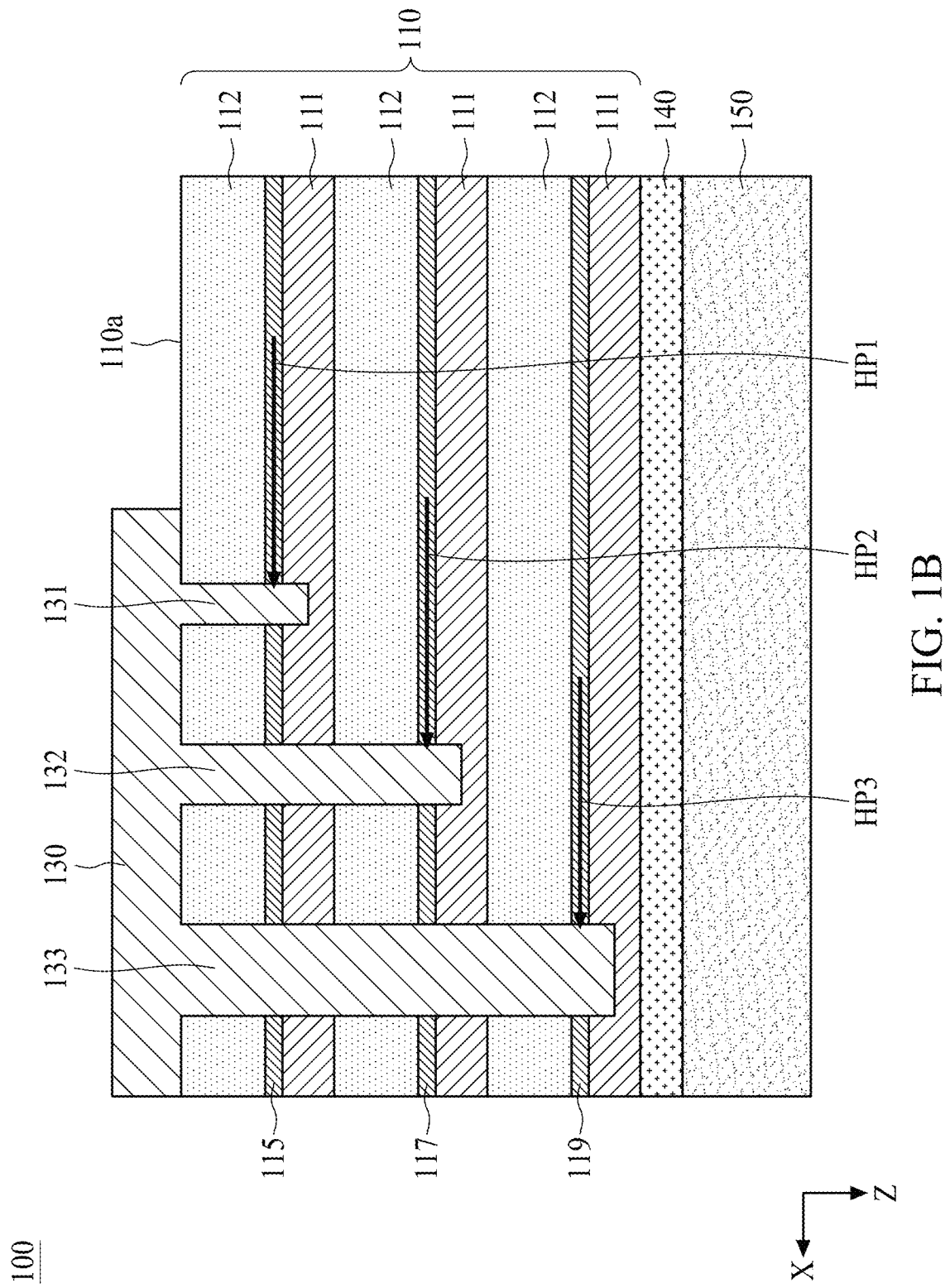
FIG. 1B is a schematic diagram of flow of electron holes in the semiconductor device in a two-dimensional hole gas channel.

FIG. 1B is a schematic diagram of flow of electron holes in the semiconductor device 100 in a two-dimensional hole gas channel. As shown in FIG. 1B, the two-dimensional hole gases (2DHGs) can be generated between each semiconductor material layer 111 and its adjacent semiconductor material layer 112. Therefore, a plurality of 2DHGs 115, 117, and 119 are generated at different depths (a direction Z as shown in FIG. 1B) of the semiconductor heterostructure layer 110. These 2DHGs 115, 117, and 119 extend along the interfaces of the semiconductor material layers 111 and the semiconductor material layers 112.

When the semiconductor device electrically connects to a power supply, the electron holes can flow in the 2DHG channels to form electron hole flowing paths. According to the embodiment in FIG. 1B, the electron holes in the 2DHGs 115, 117, and 119 all flow in the direction X. In a position approaching any one conductive finger, the electron holes will enter the conductive finger through Schottky contact between the approached conductive finger and 2DHG. For example, in the 2DHG 115 closest to the surface 110a, the electron holes can first flow through a position near the conductive finger 131. When the electron holes contact the conductive finger 131, the most of electron holes enter the conductive finger 131 through the Schottky contact between the conductive finger 131 and 2DHG 115. The electron hole flowing path is shown in FIG. 1B as HP1. In the second-layer 2DHG 117 below the surface 110a, the electron holes can first flow through a position near the conductive finger 132. When the electron holes contact the conductive finger 132, majority of electron holes enter the conductive finger 132 through the Schottky contact between the conductive finger 132 and 2DHG 117. The electron hole flowing path is shown in FIG. 1B as HP2. Accordingly, in the 2DHG 119 farthest from the surface 110a, the electron holes can first flow through a position near the conductive finger 133. When the electron holes contact the conductive finger 133, the majority of electron holes enter the conductive finger 133 through the Schottky contact between the conductive finger 133 and 2DHG 119. The electron hole flowing path is shown in FIG. 1B as HP3.

In other embodiments, the electron holes may leave conductive fingers, through the Schottky contacts between the conductive fingers 131, 132, 133 and the 2DHGs 115, 117, 119, and enter the 2DHGs 115, 117, 119.

The electron holes flowing in the 2DHGs 115, 117, and 119 at different depths can enter the conductive structure 130 through the conductive fingers 131, 132, and 133 at different depths, so that dispersion of electron holes can be achieved.

The conductive finger according to the present disclosure can be formed by a one-layer or multilayer conductive material. Taking the conductive finger in FIG. 1A as an example, it is formed by a single kind of metal material. In some embodiments, the conductive finger may include one of the following conductive materials: titanium (Ti), aluminum (Al), zirconium (Zr), chromium (Cr), nickel (Ni), copper (Cu), titanium nitride (TiN), aurum (Au), platinum (Pt), palladium (Pd), tungsten (W), and an alloy thereof.

Figure 2:
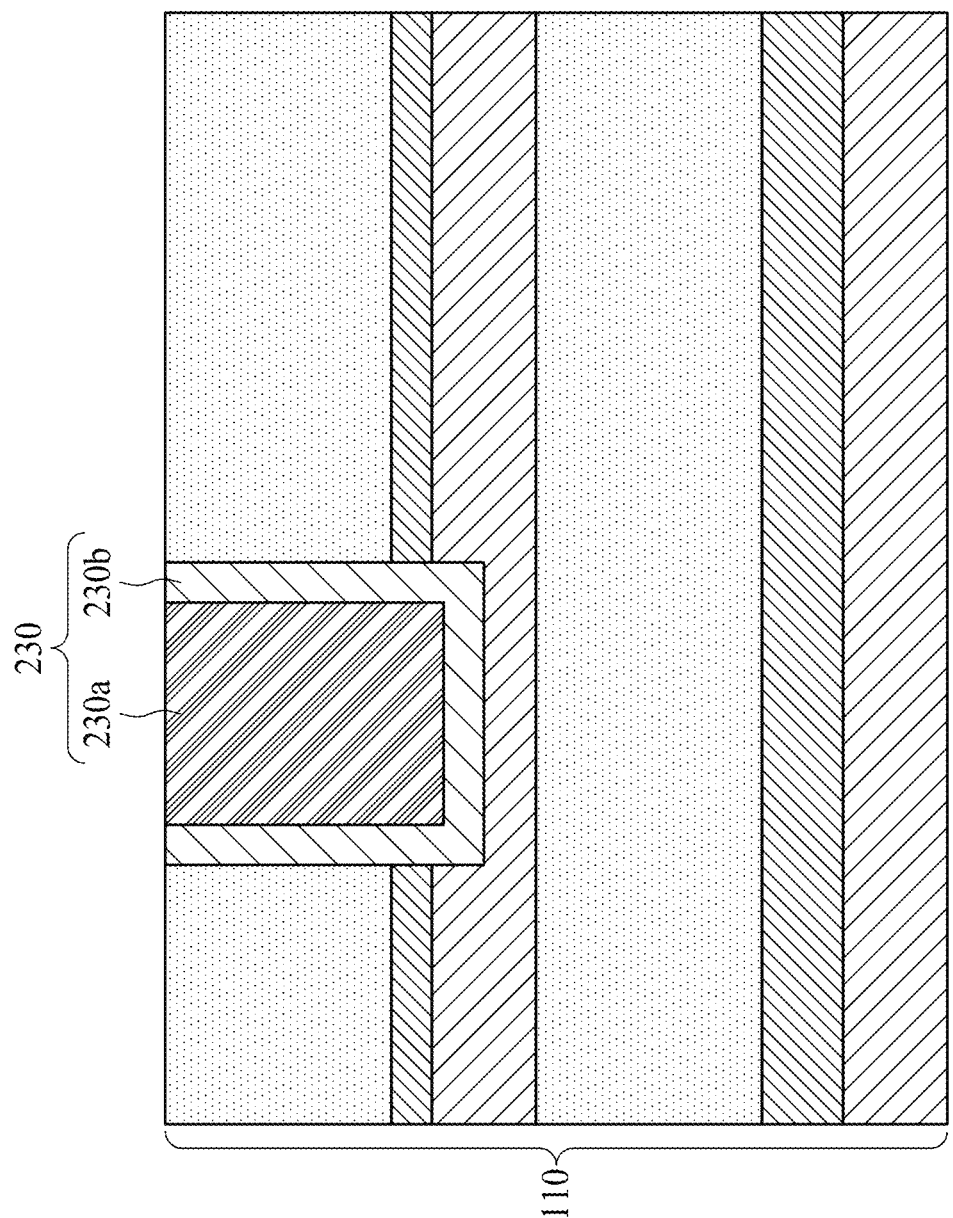
FIG. 2 is an enlarged diagram of a conductive finger according to some embodiments of the present disclosure.

However, the conductive finger used in the present disclosure is not limited to the embodiment in FIG. 1A. For example, in the embodiment in FIG. 2, a conductive finger 230 may include a metal material layer 230a and a metal material layer 230b. The metal material layer 230b is in contact with the semiconductor heterostructure layer 110. The metal material layer 230a is formed on the metal material layer 230b. The metal material layer 230b may be a single or multiple metal material layer. The metal material layer 230b may include at least one of the following: titanium (Ti), aluminum (Al), zirconium (Zr), chromium (Cr), and an alloy thereof. The metal material layer 230a may include at least one of the following: a titanium (Ti), aluminum (Al), copper (Cu), gold (Au), platinum (Pt), palladium (Pd), and a tungsten (W) layer. The metal material layer 230a can reduce resistance of the conductive finger 230.

Figure 3:
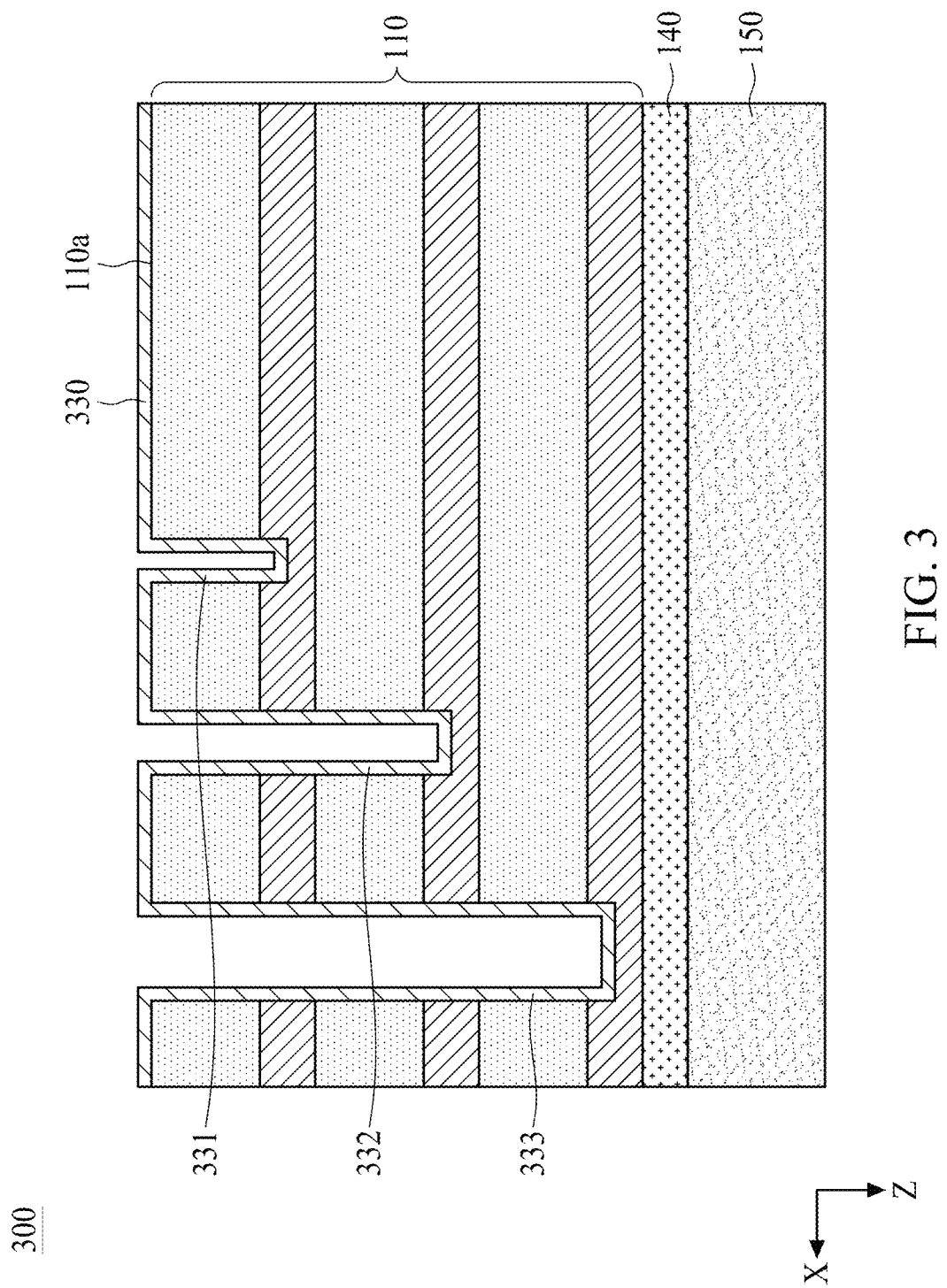
FIG. 3 is a cross-sectional view of a semiconductor device according to some embodiments of the present disclosure.

FIG. 3 is a cross-sectional view of a semiconductor device 300 according to some embodiments of the present disclosure. The semiconductor device 300 includes a semiconductor heterostructure layer 110 and a conductive structure 330. The conductive structure 330 includes conductive fingers 331, 332, and 333. In some embodiments, the conductive fingers 331, 332, and 333 may be formed by a one-layer or multilayer metal material, and may include trenches. That is, the centers of the conductive fingers 331, 332, and 333 are not completely filled with metal materials.

The conductive fingers 331, 332, and 333 may include at least one of the following: titanium (Ti), aluminum (Al), zirconium (Zr), chromium (Cr), nickel (Ni), copper (Cu), titanium nitride (TiN), gold (Au), platinum (Pt), palladium (Pd), tungsten (W), and an alloy thereof. In some embodiments, the conductive fingers may include a single or multiple metal material layers. In some embodiments, the conductive fingers may include a single or multiple metal material layers, and a titanium layer or titanium nitride (TiN) layer between the single or multiple metal material layers and the semiconductor heterostructure layer 110.

Figure 4:
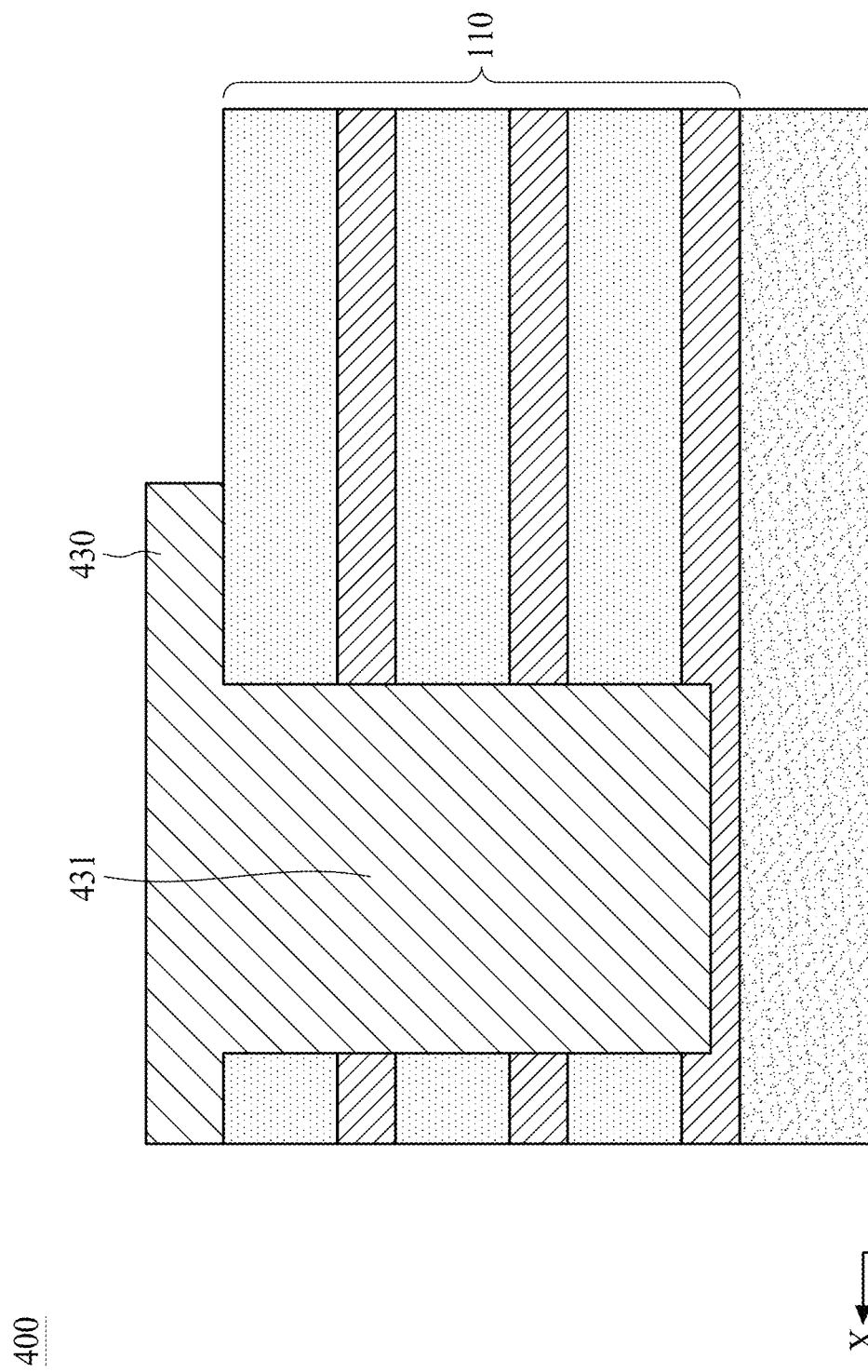
FIG. 4 is a cross-sectional view of a semiconductor device according to a comparative embodiment.

FIG. 4 is a cross-sectional view of a semiconductor device 400 according to a comparative embodiment. The semiconductor device 400 includes a semiconductor heterostructure layer 110 and a conductive structure 430. Some elements in the semiconductor device 400 are represented by the same numerals as those of the semiconductor device 100 in FIG. 1, and are made of similar materials, so detailed description thereof will not be repeated herein.

The conductive structure 430 includes a conductive finger 431 extending from a surface of the semiconductor heterostructure layer 110 in a direction Z towards the semiconductor heterostructure layer 110. When entering or leaving the conductive finger 431, electron holes in 2DHGs are crowded near an interface of the 2DHGs and the conductive finger. i.e., current crowding can occur when the electron holes enter or leave the interface of the conductive finger 431. Further, the temperature rises, it results in difficult heat dissipation, and leads to poor performance of semiconductor device 400.

Figure 5:
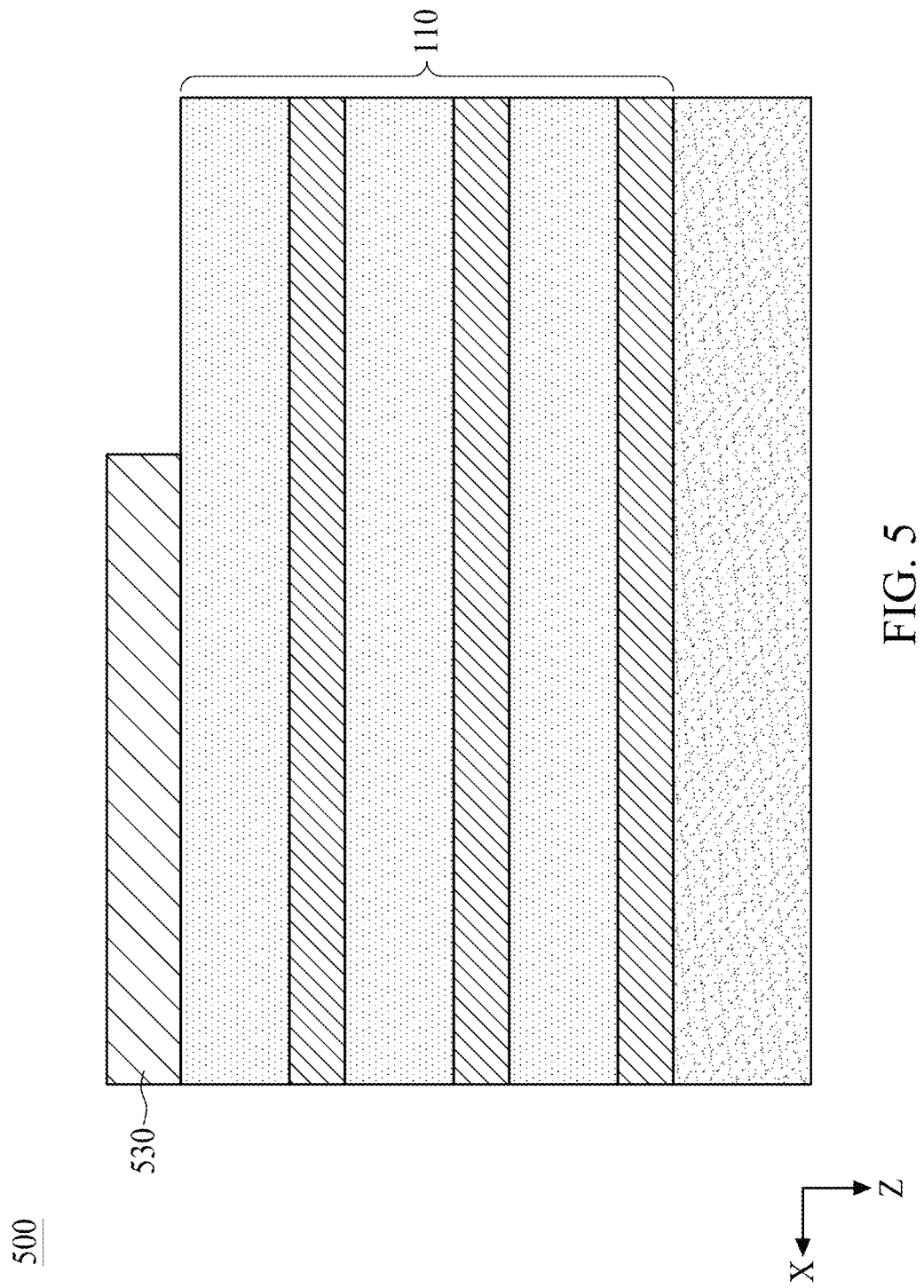
FIG. 5 is a cross-sectional view of a semiconductor device according to a comparative embodiment.

FIG. 5 is a cross-sectional view of a semiconductor device 500 according to another comparative embodiment. The semiconductor device 500 includes a semiconductor heterostructure layer 110 and a conductive structure 530. Some elements in the semiconductor device 500 are represented by the same numerals as those of the semiconductor device 100 in FIG. 1, and are made of similar materials, so detailed description thereof will not be repeated herein.

The conductive structure 530 is formed on a surface of the semiconductor heterostructure layer 110, is in direct contact with the semiconductor heterostructure layer 110, and forms a Schottky contact surface with the surface of the semiconductor heterostructure layer 110. However, majority of electron holes in the semiconductor heterostructure layer 110 flow in 2DHG channels. The Interface between 2DHGs and the conductive structure 530 has high resistance, and this will cause a high resistance for the semiconductor device 500.

Figure 6A:
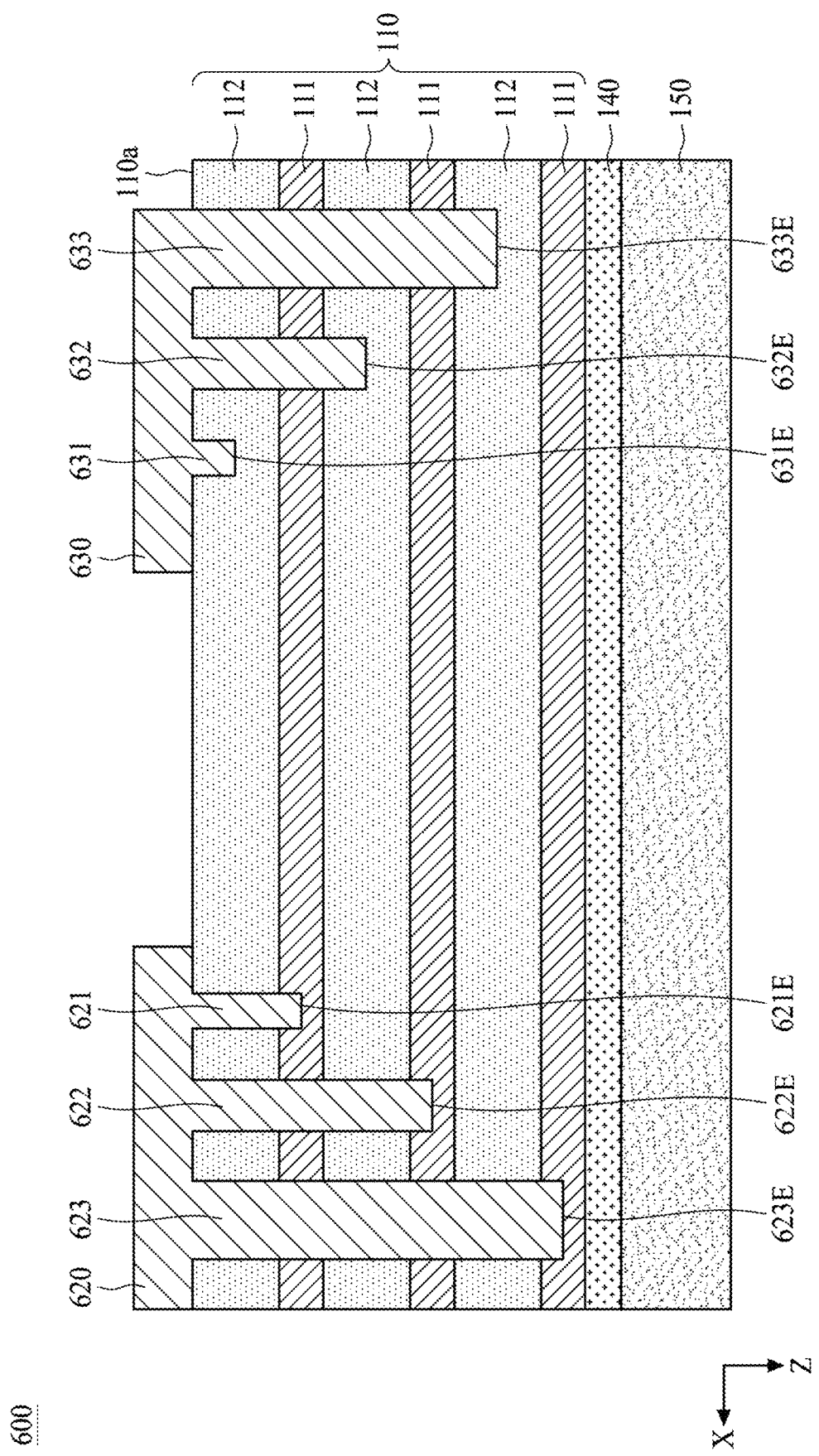
FIG. 6A is a cross-sectional view of a semiconductor device according to some embodiments of the present disclosure.

FIG. 6A is a cross-sectional view of a semiconductor device 600 according to some embodiments of the present disclosure. The semiconductor device 600 includes a semiconductor heterostructure layer 110, an electrode structure 620, an electrode structure 630. According to some embodiments of the present disclosure, the semiconductor device 600 further includes a buffer layer 140 and a carrier 150. Some elements in the semiconductor device 600 are represented by the same numerals as those of the semiconductor device 100 in FIG. 1, and are made of similar materials, so detailed description thereof will not be repeated herein.

The electrode structure 620 includes conductive fingers 621, 622, and 623. The conductive fingers 621, 622, and 623 are arranged substantially in a direction parallel to a surface 110a of the semiconductor heterostructure layer 110. End portions 621E, 622E, and 623E of each conductive finger of the electrode structure 620 are positioned in the semiconductor material layers 111 at different depths, and are in contact with 2DHGs.

In the present embodiment, the electrode structure 620 includes 3 conductive fingers. However, according to the present disclosure, the number of conductive fingers of the electrode structure 620 may be any integer greater than or equal to 2, and is not limited to the above embodiments. According to some preferred embodiments of the present disclosure, the electrode structure 620 may include 2 to 10 conductive fingers. In other preferred embodiments, the number of conductive fingers is associated with the number of interfaces between the semiconductor material layers 111 and the semiconductor material layers 112.

According to some embodiments of the present disclosure, the conductive fingers may be arranged in a direction X as shown in FIG. 6A. Additionally, the lengths of the conductive fingers 621, 622, and 623 extending deep into the semiconductor heterostructure layer 110 gradually increase in the direction X. That is, the conductive finger 621 is the shortest, the conductive finger 622 is medium-length, and the conductive finger 623 is the longest. However, in other embodiments, the conductive fingers 621, 622, and 623 of the electrode structure 620 may also be arranged in other directions substantially parallel to the surface 110a. In this case, the lengths of the conductive fingers 621, 622, and 623 of the electrode structure 620 extending deep into the semiconductor heterostructure layer 110 may gradually increase in the arrangement direction.

In some preferred embodiments of the present disclosure, the width of each conductive finger is substantially identical. In some preferred embodiments of the present disclosure, the widths of the conductive fingers increase along with their length. For example, in FIG. 6A, the lengths of the conductive fingers 621, 622, and 623 of the electrode structure 620 gradually increase in the direction X, and the widths thereof also gradually increase in the direction X. In some preferred embodiments, the lengths of the conductive fingers of the electrode structure 620 are in a range of 1 nm to 1000 nm, and the widths are in a range of 5 nm to 800 nm. In some more preferred embodiments, the lengths of the conductive fingers of the electrode structure 620 are in a range of 1 nm to 300 nm, and the widths are in a range of 5 nm to 200 nm.

The electrode structure 630 includes conductive fingers 631, 632, and 633. The conductive fingers 631, 632, and 633 are arranged substantially in a direction parallel to the surface 110a of the semiconductor heterostructure layer 110. End portions 631E, 632E, and 633E of each conductive finger of the electrode structure 630 are positioned in the semiconductor material layers 112 at different depths, and are not in contact with the 2DHGs.

In the present embodiment, the electrode structure 630 includes 3 conductive fingers. However, according to the present disclosure, the number of conductive fingers of the electrode structure 630 may be any integer greater than or equal to 2, and is not limited to the above embodiments. According to some preferred embodiments of the present disclosure, the electrode structure 630 may include 2 to 10 conductive fingers. In some preferred embodiments, the number of conductive fingers is associated with the number of interfaces between the semiconductor material layers 111 and the semiconductor material layers 112.

Additionally, the conductive fingers 631, 632, and 633 may be arranged in the direction X as shown in FIG. 6A. Additionally, the lengths of the conductive fingers 631, 632, and 633 extending deep into the semiconductor heterostructure layer 110 gradually decrease in the direction X. That is, the conductive finger 631 is the shortest, the conductive finger 632 is medium-length, and the conductive finger 633 is the longest. However, in other embodiments, the conductive fingers 631, 632, and 633 of the electrode structure 630 may also be arranged in other directions substantially parallel to the surface 110a. In this case, the lengths of the conductive fingers 631, 632, and 633 of the electrode structure 630 extending deep into the semiconductor heterostructure layer 110 may gradually decrease in the arrangement direction.

In some preferred embodiments of the present disclosure, the widths of the conductive fingers 631, 632, and 633 gradually decrease along with the length decrease. For example, in FIG. 6A, the lengths of the conductive fingers 631, 632, and 633 gradually decrease in the direction X, and the widths thereof also gradually decrease in the direction X. In some preferred embodiments, the lengths of the conductive fingers of the electrode structure 630 are in a range of 1 nm to 1000 nm, and the widths are in a range of 5 nm to 800 nm. In some more preferred embodiments, the lengths of the conductive fingers of the electrode structure are in a range of 1 nm to 300 nm, and the widths are in a range of 5 nm to 200 nm.

Figure 6B:
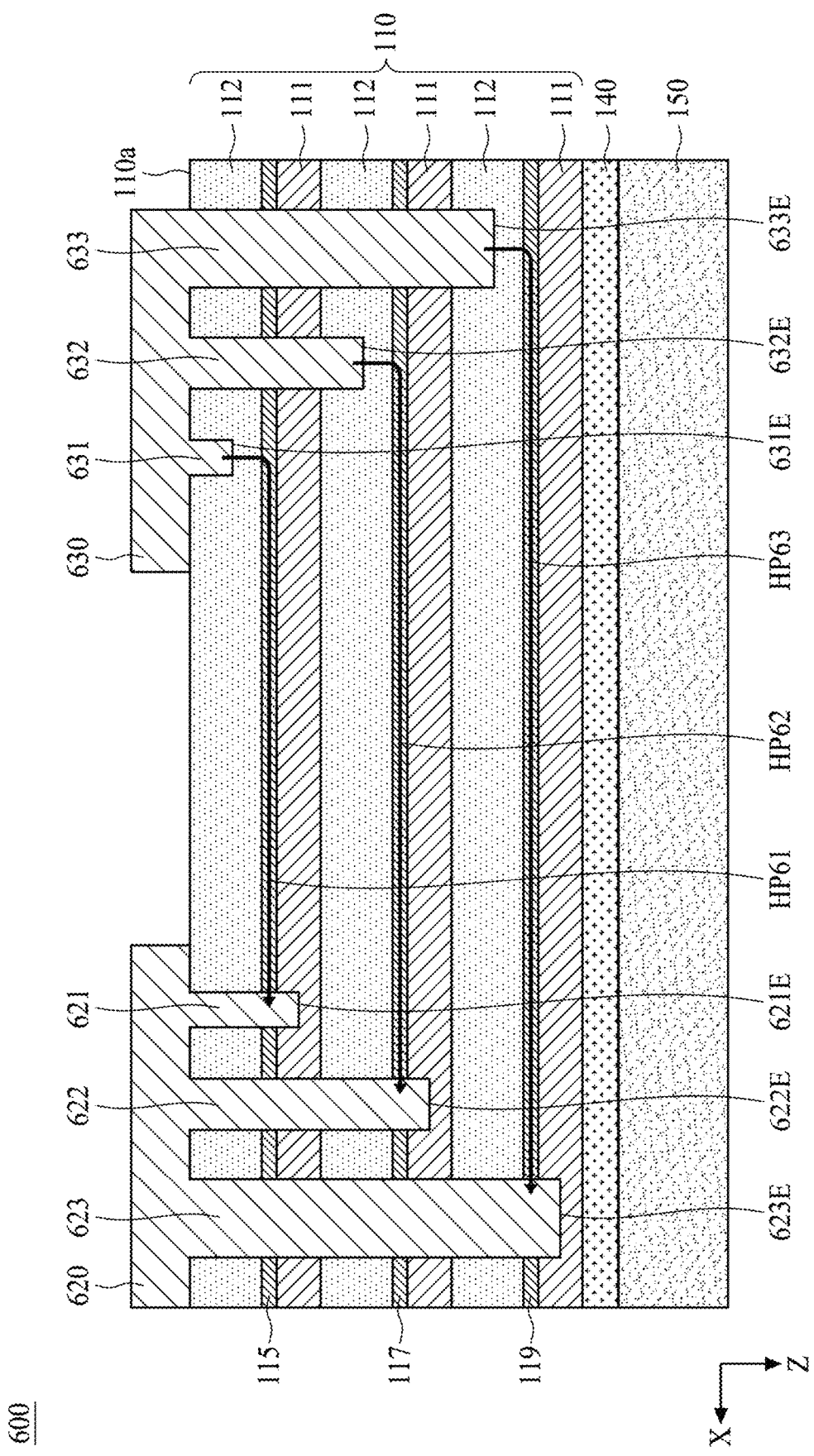
FIG. 6B is a schematic diagram of flow of electron holes in the semiconductor device in a two-dimensional hole gas channel.

FIG. 6B is a schematic diagram of flow of electron holes in the semiconductor device 600 in a two-dimensional hole gas channel. As shown in FIG. 6B, the 2DHGs can be generated between each semiconductor material layer 111 and its adjacent semiconductor material layer 112. Therefore, a plurality of 2DHGs 115, 117, and 119 are generated at different depths (a direction Z as shown in FIG. 6B) of the semiconductor heterostructure layer 110. These 2DHGs 115, 117, and 119 extend along the interfaces of the semiconductor material layers 111 and the semiconductor material layers 112.

According to some embodiments of the present disclosure, the electrode structure 620 may be a cathode electrode, and the electrode 630 may be an anode electrode. When the semiconductor device is conducted to a power supply, the electron holes can flow in the 2DHG to form hole flowing paths. According to the embodiment in FIG. 6B, the electron holes in the 2DHGs 115, 117, and 119 all flow in the direction X. The electron holes leave the conductive finger 630 from the ohmic contact between the conductive fingers 631, 632, and 633 and the semiconductor heterostructure layer 110, through the Schottky contact between closest conductive finger and the heterostructure layer 110, to enter the electrode structure 620.

For example, in the 2DHG 115 closest to the surface 110a, the electron holes leave the electrode structure 630 as an anode electrode from ohmic contact between the conductive finger 631 and the semiconductor heterostructure layer 110, and enter the 2DHG 115. When the electron holes approach the conductive finger 621 of the electrode structure 620, the majority of electron holes enter the electrode structure 620 through the Schottky contact between the conductive finger 621 and the semiconductor heterostructure layer 110. In this case, the electron hole flowing path is HP61 as shown in FIG. 6B. In the second-layer 2DHG 117 below the surface 110a, the electrode holes leave the electrode structure 630 through the ohmic contact between the conductive finger 632 and the semiconductor heterostructure layer 110, and enter the 2DHG 117. When the electron holes approach the conductive finger 622 of the electrode structure 620, the majority of electron holes enter the electrode structure 620 through the Schottky contact between the conductive finger 622 and the semiconductor heterostructure layer 110. The electron hole flowing path at that point is represented by HP62 as shown in FIG. 6B. Accordingly, in the 2DHG 119 farthest from the surface 610a, the electron holes leave the electrode structure 630 from the ohmic contact between the conductive finger 633 and the semiconductor heterostructure layer 110 to enter the 2DHG 119. When the electron holes approach the conductive finger 623 of the electrode structure 620, the majority of electron holes enter the electrode structure 620 through the Schottky contact between the conductive finger 623 and the semiconductor heterostructure layer 110. The electron hole flowing path at that point is represented by HP63 as shown in FIG. 6B.

The electron holes leave the conductive fingers 631, 632, 633 with different depths, through ohmic contacts, from the electrode structure 630 as an anode electrode to enter 2DHGs 115, 117, 119, and further enter the electrode structure 620 as a cathode electrode through the conductive fingers 621, 622, 623 with different depths, so that distribution of electron holes can be achieved.

However, the electrode structure 620 and the electrode structure 630 of the present disclosure are not limited to the embodiment in FIG. 6A. In some embodiments, the electrode structure 620 and the electrode structure 630 respectively may include a titanium nitride (TiN) or titanium (Ti) layer in contact with the semiconductor heterostructure layer 110. A single or multiple metal material layer may be further included on the titanium nitride (TiN) or titanium (Ti) layer in contact with the semiconductor heterostructure layer 110. A single or single or multiple metal material layer may be further provided on the titanium nitride (TiN) or titanium (Ti) layer. The single or single or multiple metal material layer may include at least one of the following conductive material: titanium (Ti), aluminum (Al), zirconium (Zr), chromium (Cr), nickel (Ni), copper (Cu), titanium nitride (TiN), gold (Au), platinum (Pt), palladium (Pd), tungsten (W), and an alloy thereof. In some embodiments, the electrode structure 620 and the electrode structure 630 may also include a multilayer metal material layer as the conductive finger shown in FIG. 2.

In some embodiments, the conductive fingers 621, 622, and 623 of the electrode structure 620 and the conductive fingers 631, 632, and 633 of the electrode structure 630 may be completely filled with conductive materials. In some embodiments, one or more of the conductive fingers 621, 622, and 623 of the electrode structure 620 and/or the conductive fingers 631, 632, and 633 of the electrode structure 630 may include trenches. That is, the conductive fingers are not completely filled with the conductive materials.

Figure 7:
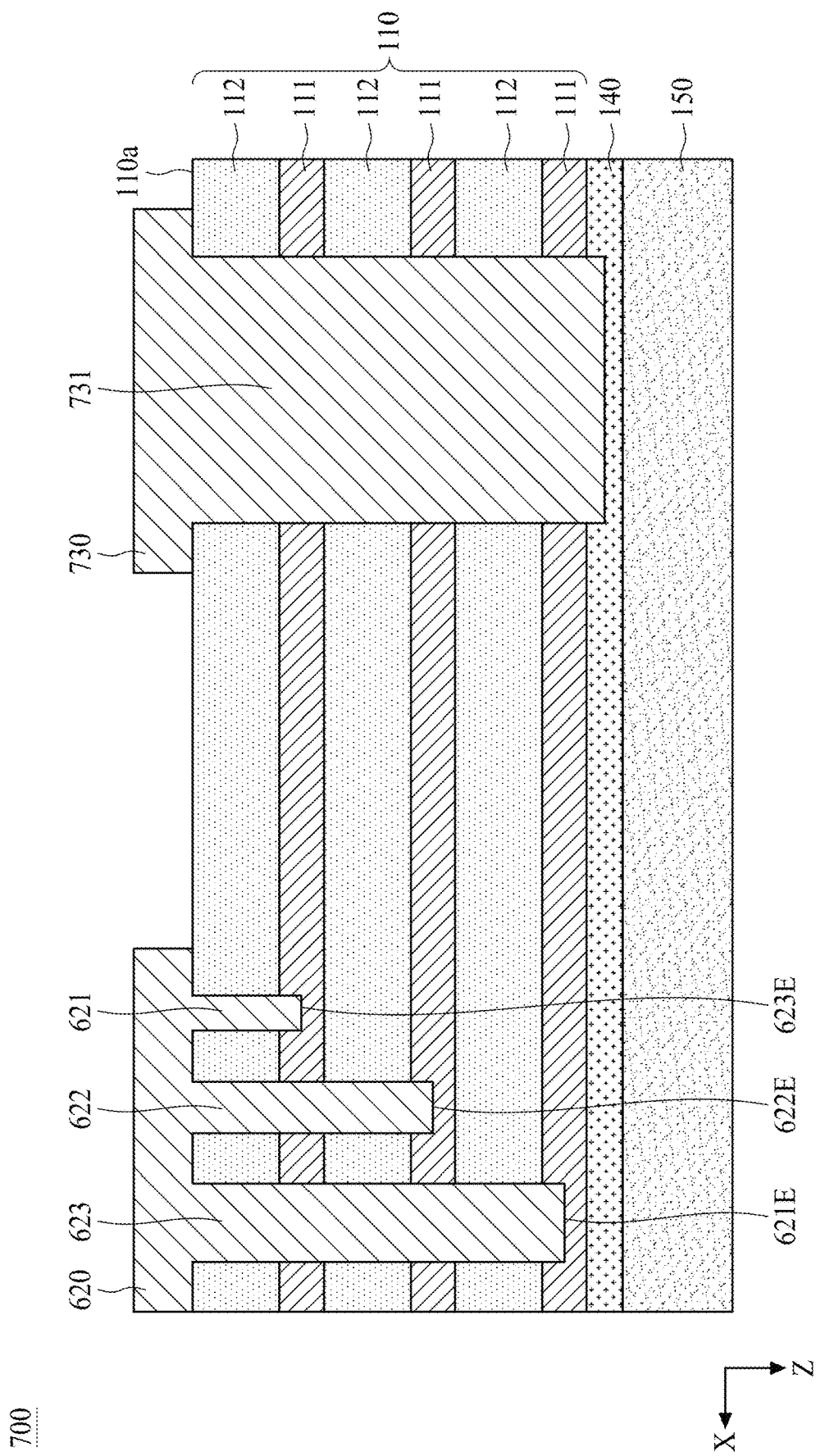
FIG. 7 is a cross-sectional view of a semiconductor device according to some embodiments of the present disclosure.

FIG. 7 is a cross-sectional view of a semiconductor device 700 according to some embodiments of the present disclosure. The semiconductor device 700 includes a semiconductor heterostructure layer 110, an electrode structure 620, and an electrode structure 730. According to some embodiments of the present disclosure, the semiconductor device 700 further includes a buffer layer 140 and a carrier 150. Some elements in the semiconductor device 700 are represented by the same numerals as those of the semiconductor device 600 in FIG. 6A, and are made of similar materials, so detailed description thereof will not be repeated herein.

The electrode structure 730 includes a conductive finger 731. The conductive finger 731 extends from a surface 110a of the semiconductor heterostructure layer 110 to the semiconductor heterostructure layer 110 in a direction Z.

When a forward conductive state is implemented between the electrode structure 620 as a cathode electrode and the electrode structure 730 as an anode electrode, electron holes will leave the electrode structure 730 through the conductive finger 731 to enter 2DHGs at each depth and then enter the electrode structure 620 through the conductive fingers 621, 622, and 623.

Figure 8:
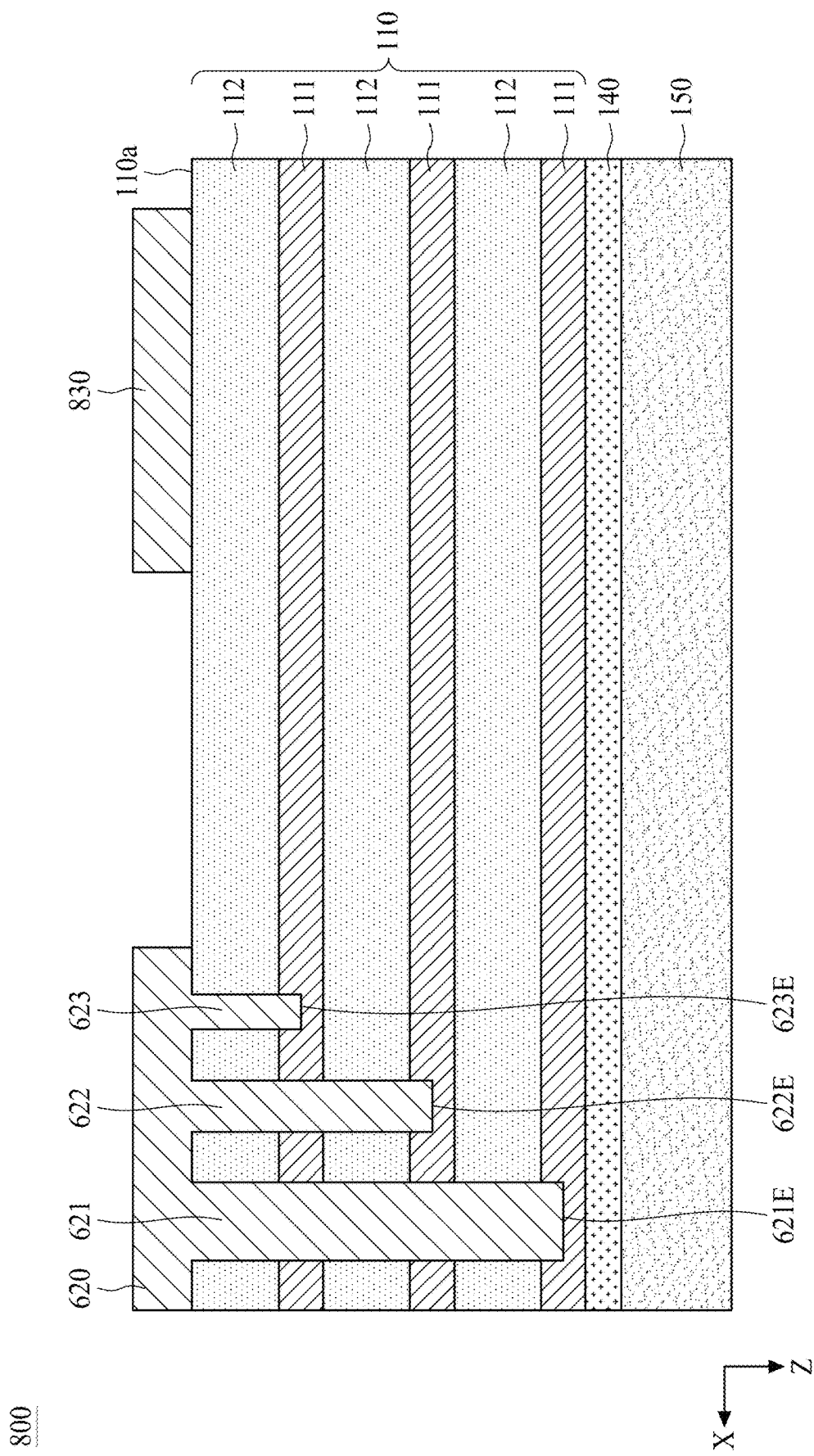
FIG. 8 is a cross-sectional view of a semiconductor device according to some embodiments of the present disclosure.

FIG. 8 is a cross-sectional view of a semiconductor device 800 according to some embodiments of the present disclosure. The semiconductor device 800 includes a semiconductor heterostructure layer 110, an electrode structure 620, and an electrode structure 830. According to some embodiments of the present disclosure, the semiconductor device 800 further includes a buffer layer 140 and a carrier 150. Some elements in the semiconductor device 800 are represented by the same numerals as those of the semiconductor device 600 in FIG. 6A, and are made of similar materials, so detailed description thereof will not be repeated herein.

The electrode structure 830 is formed on a surface 110a of the semiconductor heterostructure layer 110, and is in direct contact with the semiconductor heterostructure layer 110. The electrode structure 830 forms an ohmic contact surface with the surface 110a of the semiconductor heterostructure layer 110.

When a forward conductive state is implemented between the electrode structure 620 as a cathode electrode and the electrode structure 830 as an anode electrode, electron holes will leave the electrode structure 830 to enter 2DHGs at each depth and then enter the electrode structure 620 through the conductive fingers 621, 622, and 623.

Figure 9A:
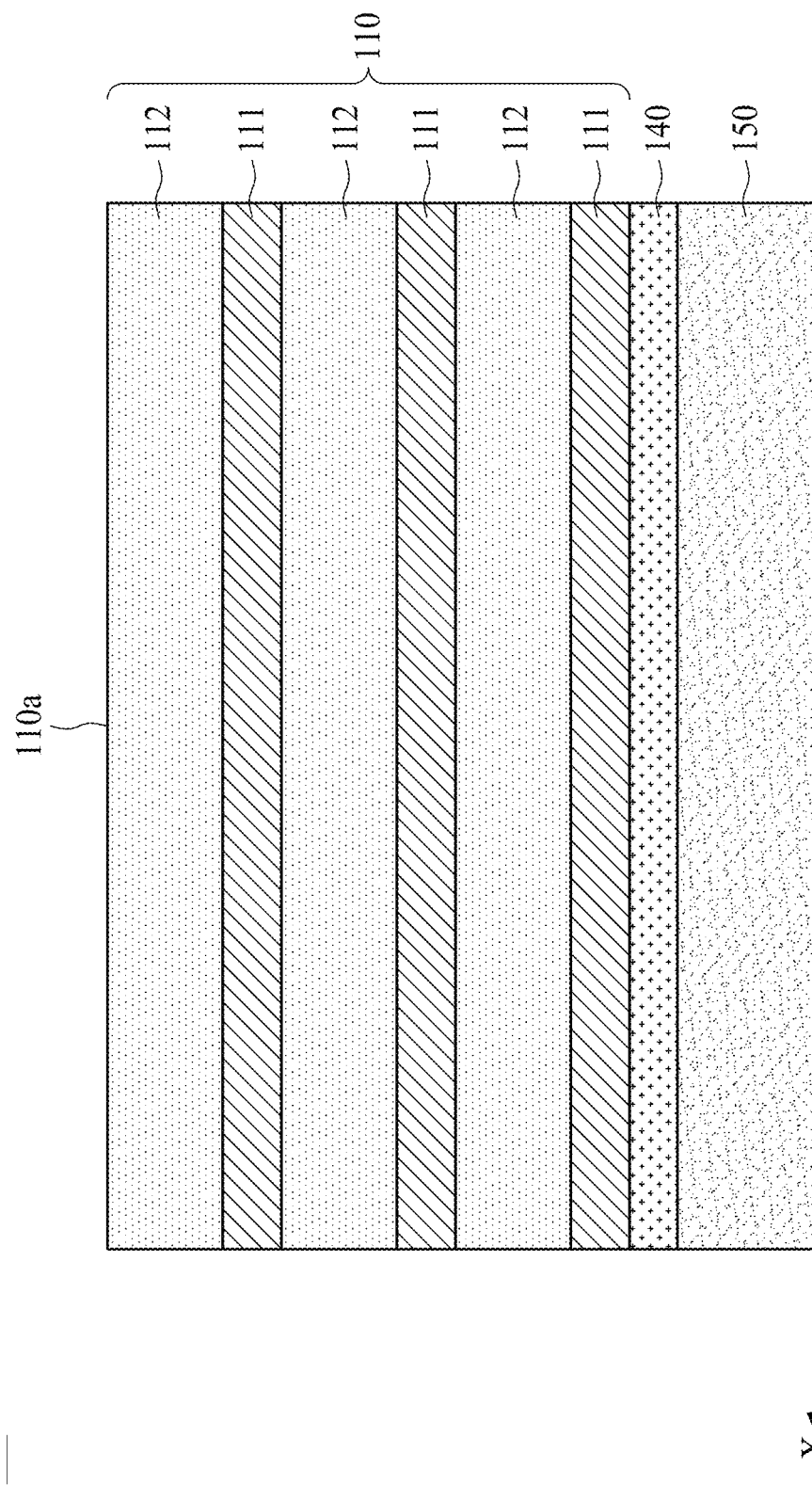
FIG. 9A, FIG. 9B, FIG. 9C, and FIG. 9D show steps of forming a semiconductor device according to some embodiments of the present disclosure.
Figure 9B:
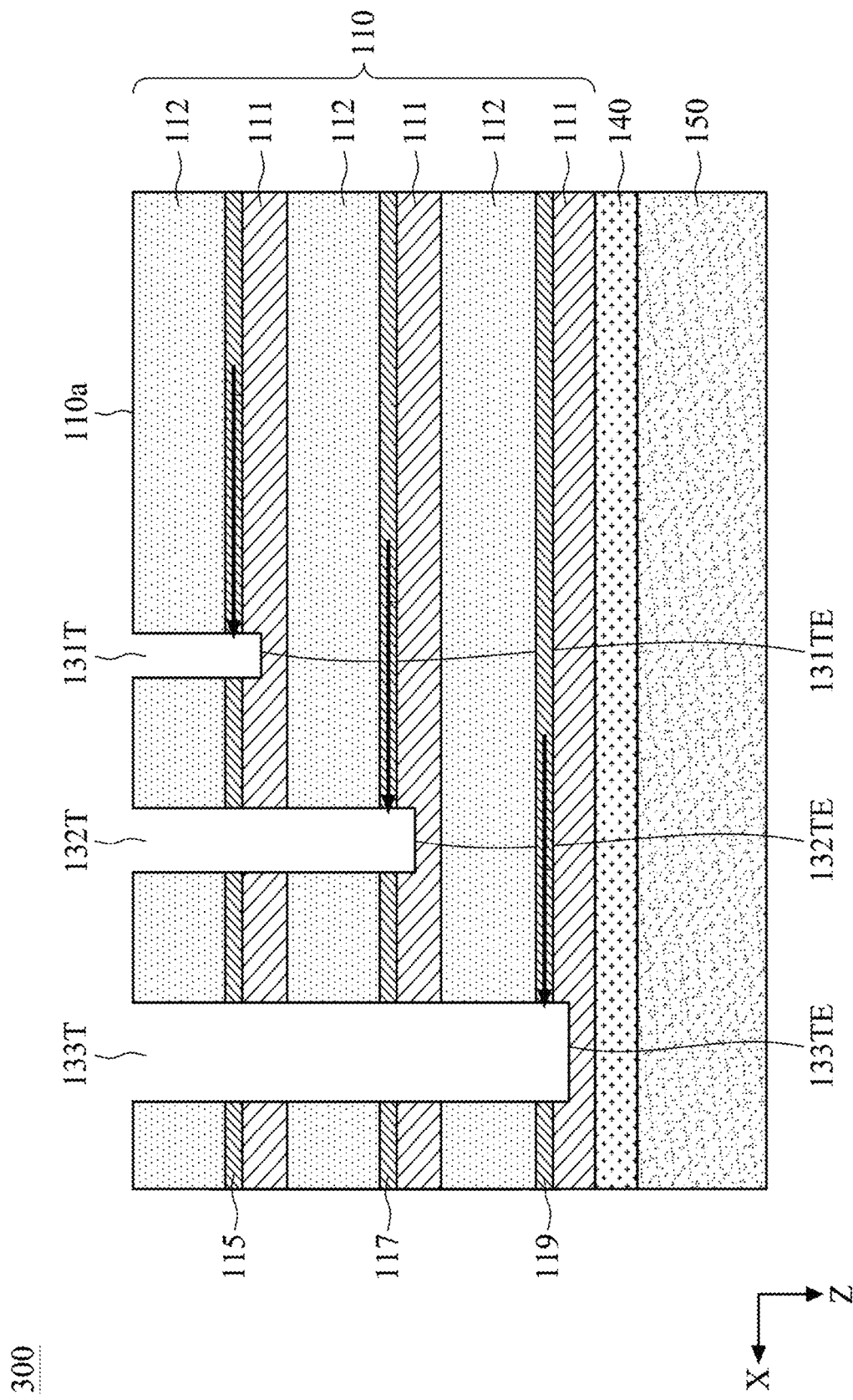
Figure 9C:
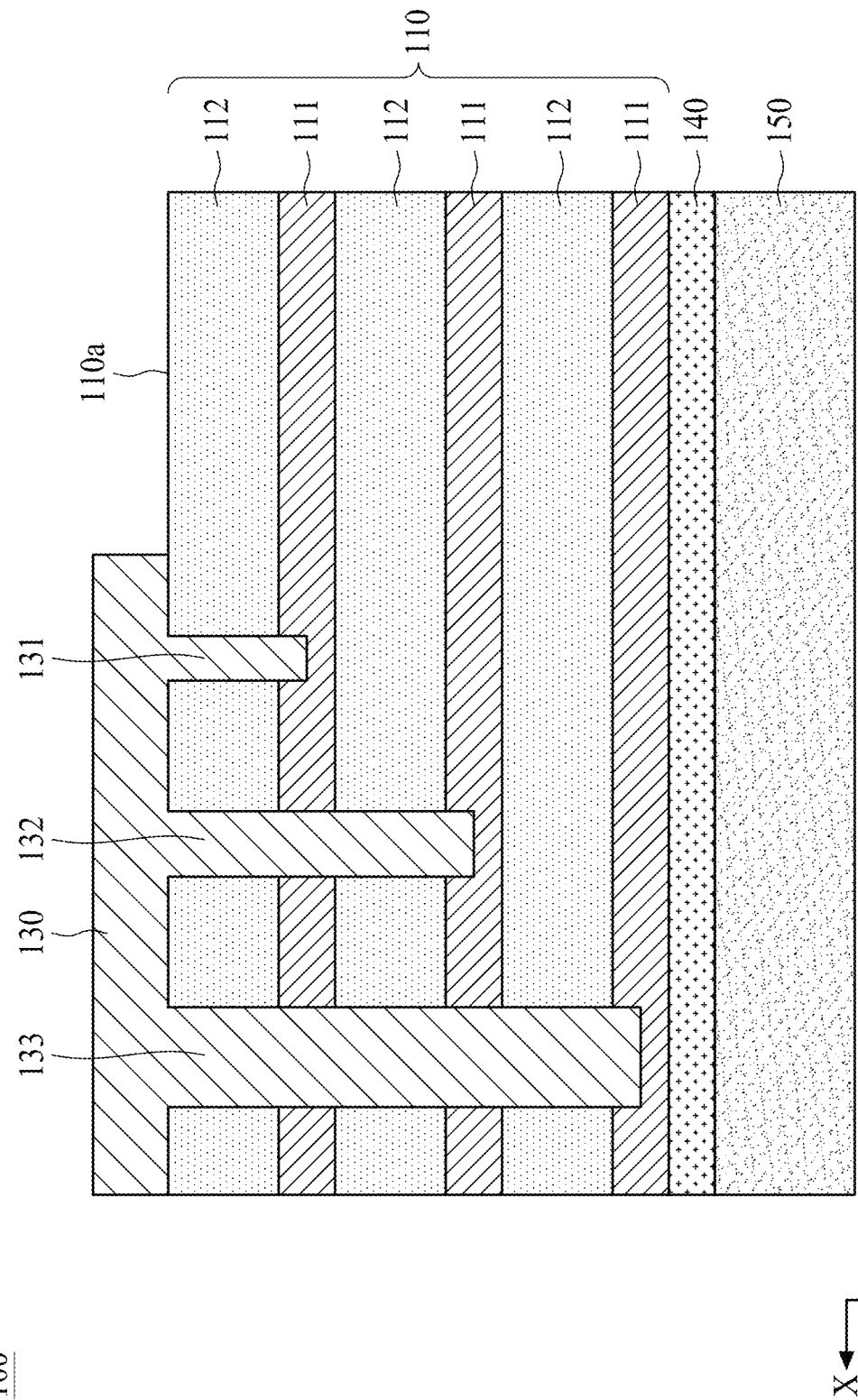

FIG. 9A, FIG. 9B, and FIG. 9C show steps of manufacturing the semiconductor device 100.

FIG. 9A shows a step of forming a stack of alternating semiconductor material layers 111 and semiconductor material layers 112 on a carrier 150 to form a semiconductor heterostructure layer 110. The semiconductor material layers 111 and the semiconductor material layers 112 may be respectively formed by any one or more modes of epitaxial growth, physical vapor deposition (PVD), chemical vapor deposition (CVD), atomic layer deposition (ALD), and the like.

In some embodiments, before the semiconductor heterostructure layer 110 is formed, a buffer layer 140 may first be formed on the carrier 150. The buffer layer 140 may be formed by any one or more modes of epitaxial growth, physical vapor deposition (PVD), chemical vapor deposition (CVD), atomic layer deposition (ALD) and the like.

FIG. 9B shows a step of forming a plurality of trenches 131T, 132T, and 133T arranged substantially in a direction parallel to a surface 110a of the semiconductor heterostructure layer 110 on the semiconductor heterostructure layer 110. According to some embodiments of the present disclosure, the surface 110a of the semiconductor heterostructure layer 110 is patterned (for example, in by lithography method) to form a plurality of openings. Through the plurality of openings, the semiconductor heterostructure layer 110 is etched to form the plurality of trenches 131T, 132T, and 133T. The plurality of trenches may be formed by one or more modes of chemical wet etching, dry etching, such as plasma etching and reactive ion etching (RIE), and the like.

In an embodiment, the plurality of openings are designed as openings with different dimensions, so that the etching speeds of the semiconductor heterostructure layer 110 at each opening are different. For example, in wet and/or dry etching, the larger the opening dimension, the higher the etching speed of the semiconductor heterostructure layer 110 in a direction Z.

In the present embodiment, the dimensions (e.g., widths) of the openings gradually increase on the surface 110a in the direction X, and through an etching process, the depths of the plurality of trenches 131T, 132T, and 133T in the direction X gradually increase. However, in other embodiments, the plurality of trenches 131T, 132T, and 133T may be arranged in other directions substantially parallel to the surface 110a. In that case, the lengths of the plurality of trenches 131T, 132T, and 133T extending deep into the semiconductor heterostructure layer 110 may also gradually increase in the arrangement direction. By designing the openings with different dimensions, the etching speeds of the semiconductor heterostructure layer 110 in the direction Z are different. Etching of the trenches at different depths can be achieved in one step, while avoiding complicated etching procedures.

According to some preferred embodiments of the present disclosure, the dimensions of the plurality of openings are designed so that the plurality of trenches 131T, 132T, and 133T can be etched in one step. Additionally, end portions 131TE, 132TE, and 133TE of each trench 131T, 132T, and 133T are positioned in the semiconductor material layers 111 at different depths in the semiconductor heterostructure layer 110, and are in contact with 2DHGs.

The dimension designs of the plurality of openings may be modified according to different materials of the semiconductor heterostructure layer 110 For example, the semiconductor heterostructure layers of structures such as AlGaN/GaN/AlGaN, InAlN/GaN/InAlN, AlN/GaN/AlN and InAlGaN/GaN/InAlGaN have respective opening dimension designs. In an embodiment, the semiconductor material layer 111 in the semiconductor heterostructure layer 110 is AlGaN. The thickness of each layer of the semiconductor material layer 111 is about 5 nm. The semiconductor material layer 112 is GaN. The thickness of each layer of the semiconductor material layer 112 is about 10 nm. An etching agent based on chlorine, for example, an etching agent including at least one of $Cl_2$ and $BCl_3$, is used to perform dry etching. Table 1 exemplarily shows a plurality of trenches with different opening widths and trench depths etched in one step.

TABLE 1

| Trench | Opening width | Trench depth |
| --- | --- | --- |
| 133T | 5 to 100 nm | 10 to 15 nm |
| 132T | 100 to 200 nm | 25 to 30 nm |
| 131T | 200 to 800 nm | 40 to 45 nm |

FIG. 9C shows a step of depositing a conductive material in the plurality of trenches 131T, 132T, and 133T so as to form a conductive structure 130 with conductive fingers 131, 132, and 133.

The conductive structure 130 may form a single or multiple metal material layer through one or more deposition steps, for example, in one or more modes of physical vapor deposition (PVD), chemical vapor deposition (CVD), and atomic layer deposition (ALD).

In some embodiments, the step of forming the conductive structure 130 may include the following: at first, a titanium (Ti) layer or a titanium nitride (TiN) layer is formed on surfaces of the trenches 131T, 132T, and 133T to be in contact with the semiconductor heterostructure layer 110; the single or multiple metal material layer, such as one of the following: titanium (Ti), aluminum (Al), zirconium (Zr), chromium (Cr), nickel (Ni), copper (Cu), titanium nitride (TiN), gold (Au), platinum (Pt), palladium (Pd), tungsten (W), and an alloy thereof is further formed; and the trenches 131T, 132T, and 133T are completely filled to form conductive fingers 131, 132, and 133. Accordingly, a Schottky contact between the conductive fingers 131, 132, and 133 of the conductive structure 130 and the semiconductor heterostructure layer 110 is formed.

Figure 9D:
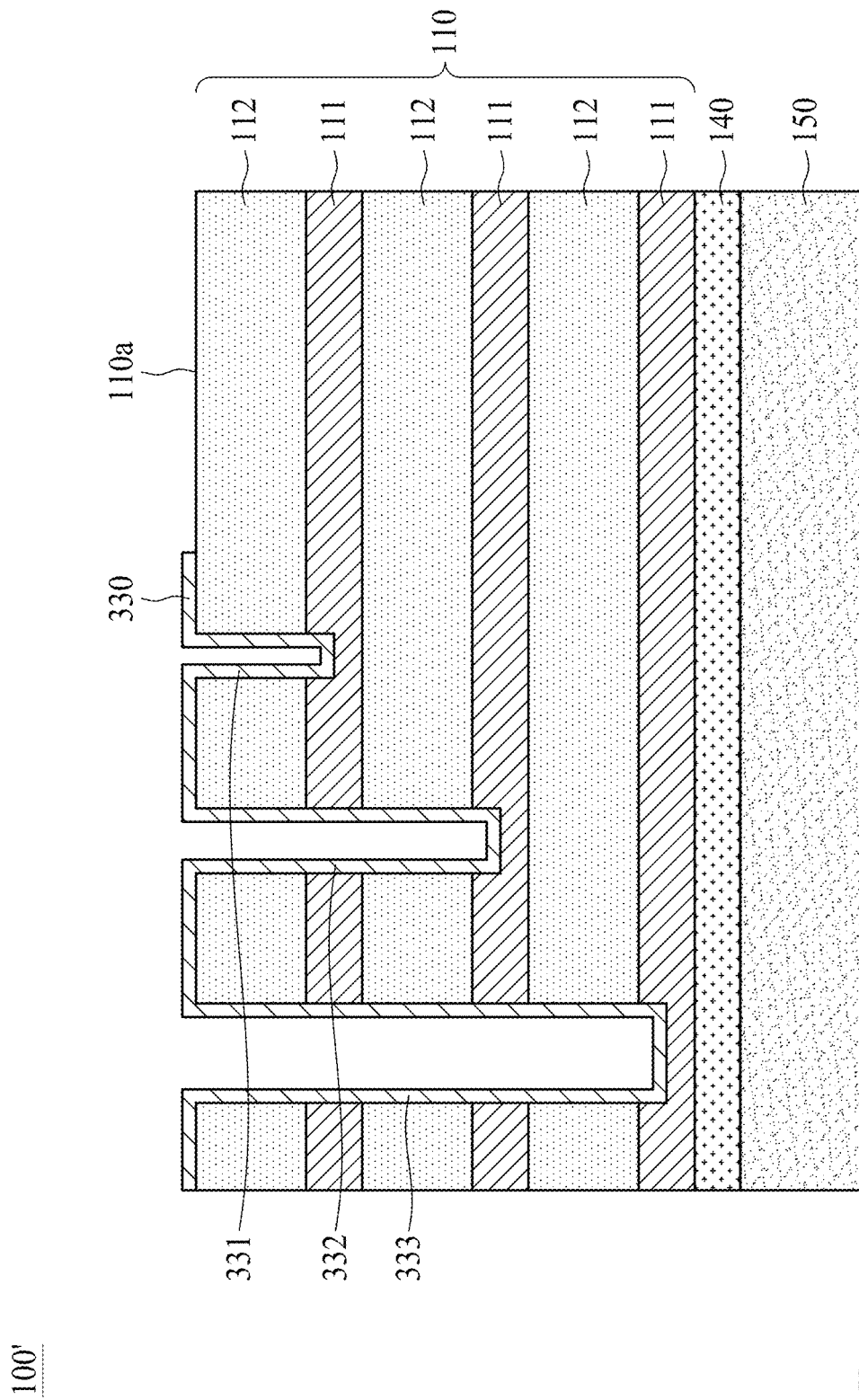

In some embodiments of the present disclosure, the step in FIG. 9C may be replaced by that in FIG. 9D to form the semiconductor device 300 in FIG. 3. FIG. 9D shows a step of depositing a conductive material in the plurality of trenches 131T, 132T and 133T to form a conductive structure 330 with conductive fingers 331, 332, and 333.

FIG. 9D is different from FIG. 9C in that the conductive material covers bottom and side surfaces of the trenches 131T, 132T, and 133T, so the trenches are still formed in the conductive fingers 331, 332, and 333.

The step of forming the conductive structure 330 may include: first, a nickel (Ni) layer or a titanium nitride (TiN)

layer is formed on the surfaces of the trenches 131T, 132T, and 133T to be in contact with the semiconductor heterostructure layer 110; and then, a single or multiple metal material layer is further formed, such as at least one of the following: titanium (Ti), aluminum (Al), zirconium (Zr), chromium (Cr), nickel (Ni), copper (Cu), titanium nitride (TiN), aurum (Au), platinum (Pt), palladium (Pd), tungsten (W), and an alloy thereof. The conductive structure 330 may be formed in one or more process of physical vapor deposition (PVD), chemical vapor deposition (CVD), atomic layer deposition (ALD), and the like. In some embodiments, partial trenches remain in the conductive fingers 331, 332, and 333.

As used herein, the terms "approximately", "basically", "substantially", and "about" are used to describe and explain small variations. When used in combination with an event or a situation, the terms may refer to an example in which an event or a situation occurs precisely and an example in which the event or situation occurs approximately. For example, when used in combination with a value, the term may refer to a variation range of less than or equal to ±10% of the value, for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, if a difference between two values is less than or equal to ±10% of an average value of the value (for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%), it could be considered that the two values are "substantially" the same. For example, "substantially" parallel may refer to an angular variation range of less than or equal to ±10° with respect to 0°, for example, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular may refer to an angular variation range of less than or equal to ±10° with respect to 90°, for example, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

If a displacement between two surfaces is not more than 5 μm, not more than 2 μm, not more than 1 μm, or not more than 0.5 μm, the two surfaces may be considered to be coplanar or substantially coplanar.

As used herein, the terms "conductive", "electrically conductive", and "electrical conductivity" refer to an ability to conduct an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a", "an", and "the" may include plural referents unless the context clearly dictates otherwise. In the description of some embodiments, assemblies provided "on" or "above" another assembly may encompass a case in which a former assembly is directly on a latter assembly (for example, in physical contact with the latter assembly), and a case in which one or more intermediate assemblies are located between the former assembly and the latter assembly.

Although the present application has been described and illustrated with reference to specific embodiments thereof, these descriptions and illustrations do not limit the present application. It should be understood by those skilled in the art that various changes may be made and equivalents may be substituted without departing from the true spirit and scope of the present application as defined by the appended claims. The drawings may not necessarily be drawn to scale. There may be variables between the artistic renditions in the present application and the actual apparatus due to manufacturing processes and tolerances. There may be other embodiments of the present application which are not specifically illustrated. The specification and drawings are to be regarded as illustrative rather than restrictive. Modifications may be made to adapt a particular situation, material, composition of matter, method, or process to the objective, spirit and scope of the present application. All such modifications are intended to be within the scope of the claims appended hereto. Although the methods disclosed herein have been described with reference to the specific operations that are performed in a specific order, it should be understood that these operations can be combined, subdivided, or reordered to form an equivalent method without departing from the teachings of the present application. Therefore, unless otherwise specifically indicated herein, the order and grouping of operations shall not be construed as any limitation on the present application.

The invention claimed is:

1. A semiconductor device, comprising:
   a semiconductor heterostructure layer, comprising alternating first semiconductor material layers and second semiconductor material layers, wherein a two-dimensional hole gas (2DHG) is generated between each first semiconductor material layer and its above adjacent second semiconductor material layer;
   a first electrode structure, comprising a plurality of first conductive fingers extending from a surface of the semiconductor heterostructure layer into the semiconductor heterostructure layer, wherein the plurality of first conductive fingers are arranged in a first direction substantially parallel to the surface, and wherein lengths of the plurality of first conductive fingers progressively increase in the first direction so that an end portion of each first conductive finger is respectively positioned in a different first semiconductor material layer and is in contact with the 2DHGs;
   a second electrode structure, comprising a plurality of second conductive fingers extending from the surface into the semiconductor heterostructure layer, wherein the plurality of second conductive fingers are arranged in the first direction, and wherein lengths of the plurality of second conductive fingers progressively decrease in the first direction so that an end portion of each second conductive finger is respectively positioned in a different second semiconductor material layer and is not in contact with the 2DHGs.

2. The semiconductor device of claim 1, wherein widths of the plurality of the first conductive fingers gradually increase in the first direction, and widths of the plurality of the second conductive fingers gradually decrease in the first direction.

3. The semiconductor device of claim 1, wherein a combination of the first semiconductor material layers and the second semiconductor material layers is one of the following: a combination of AlGaN and GaN, a combination of InAlN and GaN, a combination of AlN and GaN, and a combination of InAlGaN and GaN.

4. The semiconductor device according to claim 1, wherein the first direction is a direction in which electron holes flow in the 2DHG, or opposite that in which electron holes flow in the 2DHG.

5. The semiconductor device according to claim 1, wherein a number of layers of the 2DHGs between the first semiconductor material layers and the second semiconductor material layers is in a range of 2 to 10.

6. The semiconductor device according to claim 1, wherein a thickness of each first semiconductor material layer is in a range of 2 nm to 30 nm.

7. The semiconductor device according to claim 6, wherein the thickness of each first semiconductor material layer is in a range of 3 nm to 10 nm.

8. The semiconductor device according to claim 1, wherein a thickness of each second semiconductor material layer is in a range of 2 nm to 70 nm.

9. The semiconductor device according to claim 8, wherein the thickness of each second semiconductor material layer is in a range of 3 nm to 20 nm.

10. The semiconductor device according to claim 1, wherein a thickness of the semiconductor heterostructure layer is in a range of 8 nm to 1000 nm.

11. The semiconductor device according to claim 1, wherein the lengths of the first and second conductive fingers are in a range of 1 nm to 1000 nm.

12. The semiconductor device according to claim 11, wherein the lengths of the first and second conductive fingers are in a range of 1 nm to 300 nm.

13. The semiconductor device according to claim 1, wherein widths of the first and second conductive fingers are in a range of 5 nm to 800 nm.

14. The semiconductor device according to claim 13, wherein the widths of the first and second conductive fingers are in a range of 5 nm to 200 nm.

15. A method for manufacturing a semiconductor device, comprising:
- forming a semiconductor heterostructure layer, comprising alternately forming first semiconductor material layers and second semiconductor material layers, wherein a two-dimensional hole gas (2DHG) is generated between each first semiconductor material layer and its above adjacent second semiconductor material layer; and
- etching the semiconductor heterostructure layer to form a plurality of trenches in the semiconductor heterostructure layer along a first direction substantially parallel to a surface of the semiconductor heterostructure layer, wherein depths of the plurality of trenches progressively increase in the first direction, the etching stops in different first semiconductor material layers, and a bottom of each trench is in contact with the 2DHG; and
- depositing a conductive material in the plurality of trenches so as to form a conductive structure.

16. The method for manufacturing a semiconductor device according to claim 15, wherein widths of the plurality of trenches progressively increase in the first direction.

17. The method for manufacturing a semiconductor device according to claim 16, wherein the widths of the plurality of trenches are designed so that the plurality of trenches with different depths are formed in one etching step.

18. The method for manufacturing a semiconductor device according to claim 15, further comprising:
- forming a buffer layer on a carrier; and
- forming the semiconductor heterostructure layer on the buffer layer.

* * * * *